United States Patent

Nakajima

Patent Number: 5,164,800
Date of Patent: Nov. 17, 1992

[54] SEMICONDUCTOR DEVICE

[75] Inventor: Shigeru Nakajima, Yokohama, Japan

[73] Assignee: Sumitomo Electric Industries, Ltd., Japan

[21] Appl. No.: 748,946

[22] Filed: Aug. 23, 1991

[30] Foreign Application Priority Data

Aug. 30, 1990 [JP] Japan .................. 2-228830
Aug. 30, 1990 [JP] Japan .................. 2-228831
Aug. 30, 1990 [JP] Japan .................. 2-228832

[51] Int. Cl.$^5$ .................................. H01L 29/80
[52] U.S. Cl. .................................. 257/194; 257/197; 257/201
[58] Field of Search .................. 357/16, 22, 61

[56] References Cited

U.S. PATENT DOCUMENTS

| | | | |
|---|---|---|---|
| 4,213,781 | 7/1980 | Noreika et al. | 357/61 |
| 4,556,895 | 12/1985 | Ohata . | |
| 4,670,767 | 6/1987 | Ohta | 357/16 |
| 4,922,324 | 5/1990 | Sudo . | |
| 5,048,036 | 9/1991 | Scifres et al. | 357/16 |

FOREIGN PATENT DOCUMENTS

2609841 7/1988 France .
2621174 5/1989 France .

OTHER PUBLICATIONS

Patent Abstracts of Japan, vol. 10, No. 69, Mar. 18, 1986; & JP-A-60 219778 (Nippon Denki).
Patent Abstracts of Japan, vol. 10, No. 35, Dec. 3, 1986 and JP-A-61 156 773 (Sumitomo Electric Ind. Ltd).
Aina et al, "Novel AlInAs/InP HEMT", *Electronics Letters*, vol. 26, No. 10, pp. 651-652, (May 10, 1990).

Primary Examiner—John D. Lee
Assistant Examiner—Robert E. Wise
Attorney, Agent, or Firm—Beveridge, DeGrandi & Weilacher

[57] ABSTRACT

This invention is a semiconductor device comprising a heterojunction of $(AlAs)_x(InSb)_{1-x}$ wherein a composition ratio x is 0.65 to 0.85 and InP. In addition, this invention is a semiconductor device comprising a heterojunction of $(AlAs)_x(GaSb)_{1-x}$ wherein a composition ratio x is 0.4 to 0.6 and InP. Furthermore, this invention is a semiconductor device comprising a heterojunction of $GaAs_xSb_{1-x}$ wherein a composition ratio x is 0.4 to 0.6 and InP. Each heterojunction is formed with good crystal lattice matching properties in an interface. Since an interface level concentration in the heterojunction interface is reduced, various conventional problems caused by a high-concentration interface level can be solved. In addition, since characteristics such as a high saturated electron speed and a high thermal conductivity of InP are achieved in a semiconductor device, a high-power element having good RF characteristics can be provided.

15 Claims, 10 Drawing Sheets (AℓAs)x(InSb)1-x

InP

SEMICONDUCTOR DEVICE

BACKGROUND OF THE INVENTION

1. Field of the Invention

The present invention relates to a semiconductor device such as a field-effect transistor (FET) using a heterojunction consisting of InP.

2. Related Background Art

InP has a saturated electron speed higher than that of GaAs or InGaAs and a thermal conductivity higher than that of GaAs. Therefore, an FET formed by using this InP is suitable as a high-power circuit element in an RF circuit. On the other hand, it is conventionally impossible to form a Schottky junction consisting of InP and having a good junction state. For this reason, a MIS heterojunction FET in which an insulating film such as an $SiO_2$ film or an SiN film is formed on the junction surface has been developed.

In such a MISFET using InP, however, since the insulating layer is formed in the junction surface between a metal and a semiconductor, a high-concentration interface level is present in the interface between the semiconductor and the insulating layer. Therefore, due to this interface level, a drift occur in a drain current and a hysteresis in transfer characteristics occur in a low-frequency region.

In addition, a GaAs-based high electron mobility transistor (HEMT) using a two-dimensional electron gas formed in an AlGaAs/GaAs heterojunction interface is available, and an HEMT using a heterojunction consisting of InP has been studied.

This InP-based HEMT has, for example, a structure as shown in FIG. 1. This structure is disclosed in "Novel AlInAs/InP.HEMT" (ELECTRONICS LETTERS, May. 10, 1990, Vol. 26, No. 10, page 651). Referring to FIG. 1, an AlInAs layer 2 as a buffer layer and an InP layer 3 as an active layer are formed on an InP semiconductor substrate 1. An undoped AlInAs layer 4 is formed on the InP layer 3, and an n+-type AlInAs layer 5 and an n+-type InP layer 6 are formed on the AlInAs layer 4. A gate electrode 7 is formed on the AlInAs layer 5, and a drain electrode 8 and a source electrode 9 are formed on the InP layer 6. This HEMT using an AlInAs/InP heterojunction is also promising as a high-power circuit element for use in an RF circuit.

However, in such an HEMT using an n-AlInAs/InP heterojunction, compatibility between Al and P elements in the interface of AlInAs and InP is low, and crystal matching properties therebetween is poor. For this reason, in the InP-based HEMT, high-mobility electrons as those obtained in a GaAs-based HEMT cannot be obtained, and no good RF characteristics can be achieved.

SUMMARY OF THE INVENTION

It is an object of the present invention to solve the above conventional problems. The present invention is a semiconductor device comprising a heterojunction of $(AlAs)_x(InSb)_{1-x}$ wherein a composition ratio X is 0.65 to 0.85 and InP.

In addition, the present invention is a semiconductor device comprising a heterojunction of $(AlAs)_x(GaSb)_{1-x}$ wherein a composition ratio X is 0.4 to 0.6 and InP.

Furthermore, the present invention is a semiconductor device comprising a heterojunction of $GaAs_xSb_{1-x}$ wherein a composition ratio X is 0.4 to 0.6 and InP.

Also, the present invention is an HEMT or a heterojunction bipolar transistor (HBT) using any one of the above heterojunctions.

According to the present invention as described above, the heterojunction of $(AlAs)_x(InSb)_{1-x}$ wherein a composition ratio X is 0.65 to 0.85 and InP is formed with good crystal lattice matching properties in the interface. In addition, the heterojunction of $(AlAs)_x(GaSb)_{1-x}$ wherein a composition ratio X is 0.4 to 0.6 and InP is formed with good crystal lattice matching properties in the interface. Furthermore, the heterojunction of $GaAs_xSb_{1-x}$ wherein a composition ratio X is 0.4 to 0.6 and InP is formed with good crystal lattice matching properties in the interface.

For this reason, since an interface level concentration in each of the above heterojunction interfaces is reduced, the various conventional problems caused by a high-concentration interface level can be solved. In addition, since characteristics such as a high saturated electron speed and a high thermal conductivity of InP are achieved in a semiconductor device, a high-power element having good RF characteristics can be provided.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

The first embodiment in which a heterojunction according to the present invention is applied to an HEMT will be described below.

Figure 1:
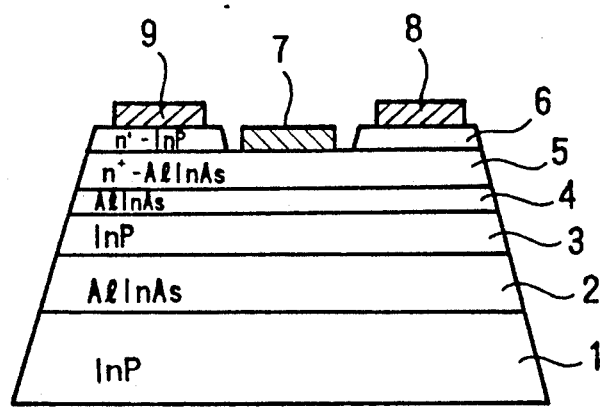
FIG. 1 is a sectional view showing a structure of a conventional HEMT.
Figure 2:
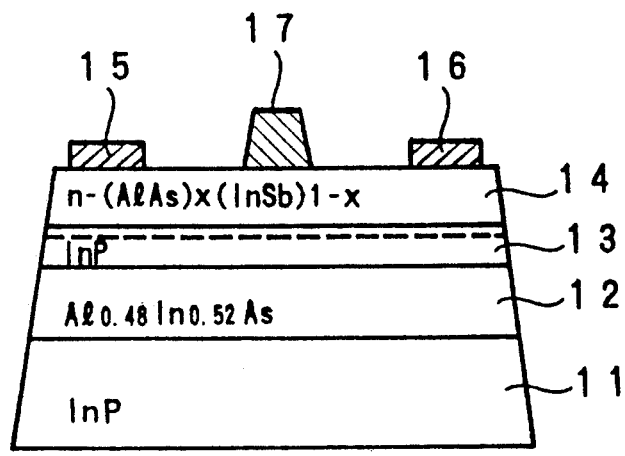
FIG. 2 is a sectional view showing a structure of an HEMT according to the first embodiment of the present invention.

FIG. 2 is a sectional view showing a structure of an InP-based HEMT according to the first embodiment of the present invention, which is completed via the following manufacturing steps.

First, a buffer layer 12, a channel layer 13, and an electron supply layer 14 are sequentially formed on a semi-insulating InP semiconductor substrate 11 by a crystal growth technique such as an MBE (Molecular Beam Epitaxy) method. The buffer layer 12 consists of undoped $Al_{0.48}In_{0.52}As$ and has a thickness of about 1 μm. The channel layer 13 consists of undoped InP and has a thickness of 1,000 Å. The electron supply layer 14 consists of $(AlAs)_x(InSb)_{1-x}$ wherein a composition ratio x of AlAs is 0.65 to 0.85, and a donor impurity at a concentration of $1 \times 10^{18}/cm^3$ is added to this $(AlAs)_x(InSb)_{1-x}$. At this composition ratio, the electron supply layer 14 consisting of $n-(AlAs)_x(InSb)_{1-x}$ and the channel layer 13 consisting of undoped InP attain good lattice matching. The thickness of the electron supply layer 14 is 500 Å.

Subsequently, a mask pattern for element isolation is formed on the electron supply layer 14 by a conventional photolithography technique. Mesa etching is performed using this pattern to electrically isolate the respective elements, and the formed mask pattern is removed. A metal such as AuGe/Ni is deposited on the exposed electron supply layer 14, and the deposited metal is selectively removed by the photolithography technique. Alloying processing is performed to form an ohmic contact between the metal and the electron supply layer 14, thereby forming a source electrode 15 and a drain electrode 16.

Lastly, a mask pattern is formed by the photolithography technique to selectively form, e.g., Ti/Pt/Au. A Schottky contact is formed between this metal and the electron supply layer 14 to form a gate electrode 17. As a result, an HEMT having the structure shown in FIG. 2 is completed.

The lattice constants of AlAs and InSb in the electron supply layer 14 are 5.65 Å and 6.5 Å, respectively. Therefore, since $(AlAs)_x(InSb)_{1-x}$ is constituted such that the composition ratio x of AlAs falls within the range of 0.65 to 0.85, $(AlAs)_x(InSb)_{1-x}$ lattice-matches with InP having a lattice constant of 5.87 Å to form a heterojunction in a good junction state.

Figure 3A:
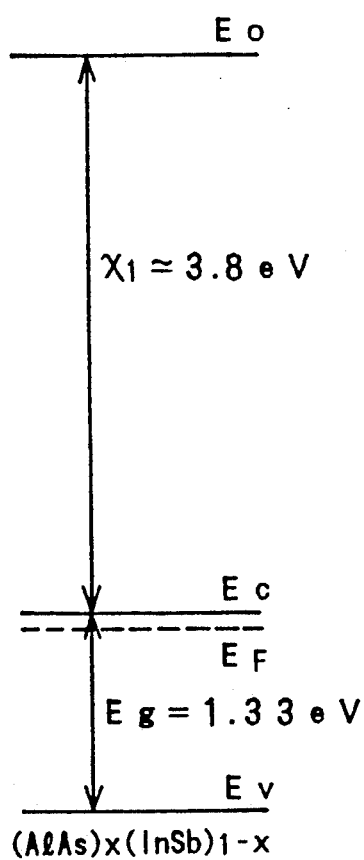
FIGS. 3A, 3B and 3C are diagrams showing an energy band structure of a heterojunction according to the first embodiment.
Figure 3B:
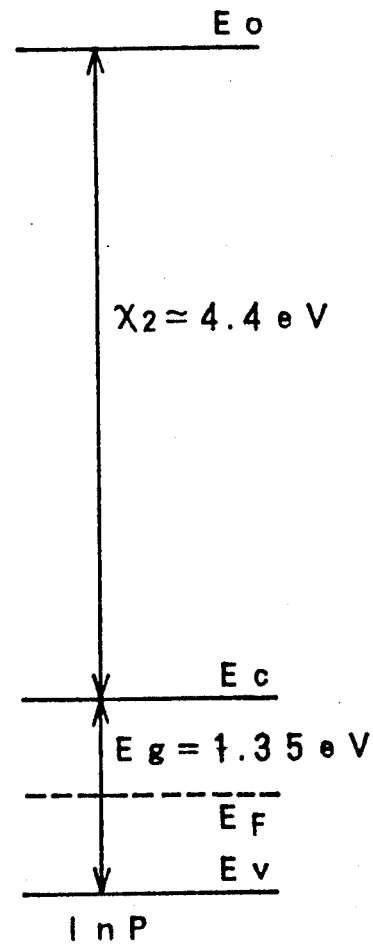

FIG. 3A is an energy band diagram of $(AlAs)_x(InSb)_{1-x}$ at the above composition ratio at which it precisely lattice-matches with InP. Referring to FIG. 3A, an energy gap Eg corresponding to a difference between an energy level Ec at the bottom of a conduction band and an energy level Ev at the top of a valence band is 1.33 eV. Therefore, it is assumed that an electron affinity $\chi_1$ for extracting electrons at the energy level Ec of the bottom of the conduction band to a vacuum level $E_0$ is about 3.8 eV. An energy band diagram of InP is shown in FIG. 3B in which the energy band gap Eg is 1.35 eV and an electron affinity $\chi_2$ is about 4.4 eV. Therefore, as shown in FIG. 3C, an energy spike having a magnitude ΔEc of about 0.6 eV corresponding to an electron affinity difference $(\chi_2 - \chi_1)$ between $(AlAs)_x(InSb)_{1-x}$ and InP is generated in a conduction band at the heterojunction portion therebetween.

A two-dimensional electron gas indicated by a dotted line in FIG. 2 is generated in the interface of the heterojunction of the HEMT according to this embodiment, i.e., in a portion of the undoped-InP channel layer 13 near the interface between the electron supply layer 14 consisting of n-AlInAsSb and the channel layer 13. This two-dimensional electron gas is represented as follows in an energy band diagram of a region of the gate electrode 17 shown in FIG. 4. The left side of FIG. 4 corresponds to the gate electrode 17 (gate metal), its central portion corresponds to the electron supply layer 14 $(n-(AlAs)_x(InSb)_{1-x})$, and its right side corresponds to the channel layer 13 (undoped InP). The energy level Ec at the bottom of the conduction band and a Fermi level $E_F$ are indicated by solid and dotted lines, respectively.

Figure 3C:
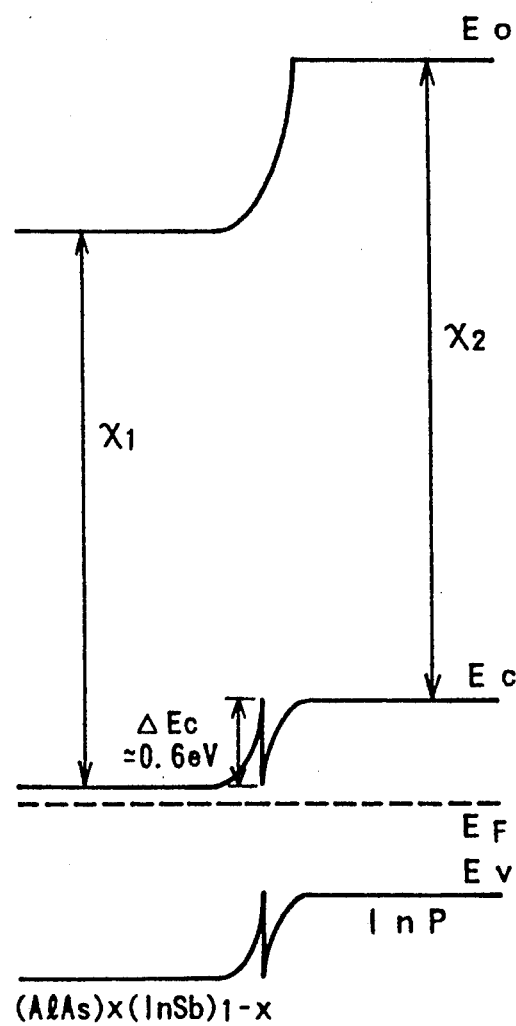

The energy spike having the magnitude ΔEc of about 600 meV shown in FIG. 3C appears in the junction portion between the electron supply layer 14 and the channel layer 13. Electrons released from a donor impurity added to the electron supply layer 14 are stored in this spike portion as indicated by a hatched line portion in FIG. 4 to generate a two-dimensional electron gas. The concentration of this two-dimensional electron gas is adjusted by an application voltage to the gate electrode 17.

As described above, the $(AlAs)_x(InSb)_{1-x}/InP$ heterojunction interface according to this embodiment has good crystal lattice matching and high quality. Therefore, since the concentration of the interface level in the heterojunction interface is decreased, neither a drift in a drain current nor a hysteresis in transfer characteristics occurs unlike in a conventional heterojunction. In addition, the two-dimensional electron gas is formed in the channel layer 13 near the high-quality interface, and this channel layer 13 is formed by InP having good electron transport characteristics in a high electric field. For this reason, the mobility of the two-dimensional electron gas is increased. Therefore, the heterojunction according to this embodiment can be effectively used in a high-frequency circuit element to which a high electric field is applied, as well as an HEMT.

Figure 4:
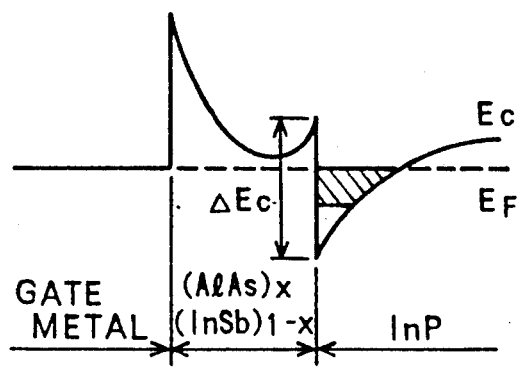
FIG. 4 is a diagram showing an energy band structure in a gate region of the HEMT according to the first embodiment.

An electron affinity difference between $(AlAs)_x(InSb)_{1-x}$ and InP is about 0.6 eV as described above, and an electron affinity difference between AlInAs and InP in a conventional AlInAs/InP heterojunction is about 0.2 eV. For this reason, since the magnitude ΔEc of the energy spike shown in FIG. 4 is increased to be larger than that in the conventional heterojunction, the storage amount of the two-dimensional electron gas is increased to achieve a high gas concentration. Therefore, since a current amount to be supplied to the channel layer 13 of the HEMT is increased, there is provided a high-power, high-frequency circuit element having high current drive power.

Although the heterojunction according to the present invention is applied to an HEMT in the above embodiment, the present invention is not limited to the above embodiment. For example, the present invention can be similarly applied to an HBT to achieve the same effects as those obtained in the above embodiment. An HBT in this case is formed by using $(AlAs)_x(InSb)_{1-x}$ ($0.65 \leq x \leq 0.85$), p-InP, and n-InP as an emitter, a base, and a collector, respectively.

Figure 5:
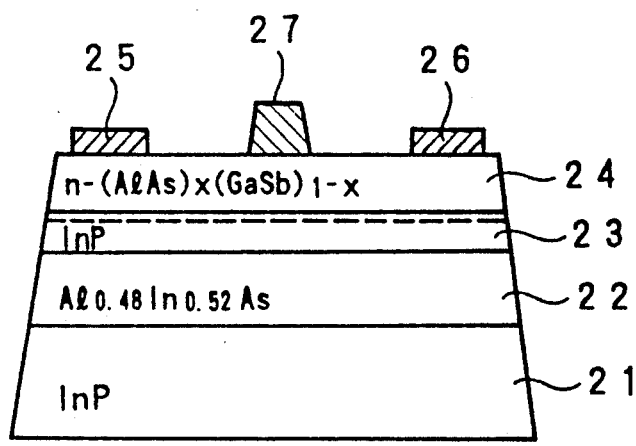
FIG. 5 is a sectional view showing a structure of an HEMT according to the second embodiment of the present invention.

FIG. 5 is a sectional view showing a structure of an InP-based HEMT according to the second embodiment of the present invention, which is completed via the following manufacturing steps.

First, a buffer layer 22, a channel layer 23, and an electron supply layer 24 are sequentially formed on a semi-insulating InP semiconductor substrate 21 by a crystal growth technique such as an MBE method. The buffer layer 22 consists of undoped $Al_{0.48}In_{0.52}As$ and has a thickness of about 1 μm. The channel layer 23 consists of undoped InP and has a thickness of 1,000 Å. The electron supply layer 24 consists of $(AlAs)_x(GaSb)_{1-x}$ wherein a composition ratio x of AlAs is 0.4 to 0.6, and a donor impurity having a concentration of $1 \times 10^{18}/cm^3$ is added to this $(AlAs)_x(GaSb)_{1-x}$. At this composition ratio, the electron supply layer 24 consisting of n-$(AlAs)_x(GaSb)_{1-x}$ and the channel layer 23 consisting of undoped InP have good lattice matching. The thickness of the electron supply layer 24 is 500 Å.

Subsequently, mesa etching similar to that in the above embodiment is performed to electrically isolate the respective elements, and a metal such as AuGe/Ni is deposited on the electron supply layer 24 following the same procedures as in the above embodiment, thereby forming a source electrode 25 and a drain electrode 26.

Lastly, Ti/Pt/Au or the like is selectively formed to form a gate electrode 27. As a result, an HEMT having the structure shown in FIG. 5 is completed.

The lattice constants of AlAs and GaSb in the electron supply layer 24 are 5.65 Å and 6.10 Å, respectively. Therefore, since $(AlAs)_x(GaSb)_{1-x}$ is constituted such that the composition ratio x of AlAs falls within the range of 0.4 to 0.6, $(AlAs)_x(GaSb)_{1-x}$ lattice-matches with InP having a lattice constant of 5.87 Å to form a heterojunction in a good junction state.

Figure 6A:
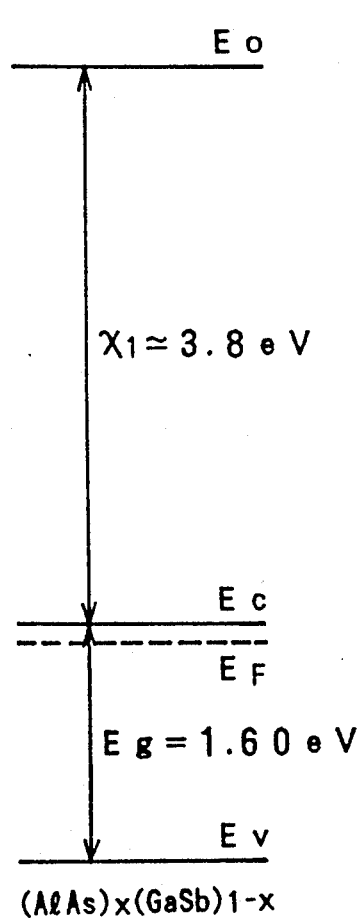
FIGS. 6A, 6B and 6C are diagrams showing an energy band structure of a heterojunction according to the second embodiment.
Figure 6B:
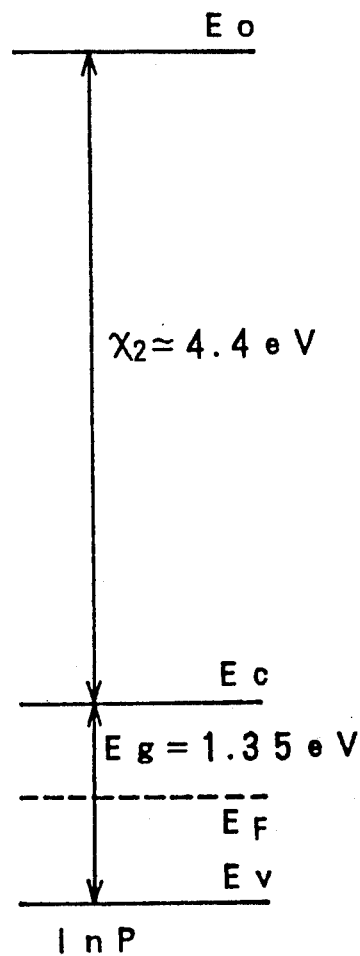

FIG. 6A is an energy band diagram of $(AlAs)_x(GaSb)_{1-x}$ at the above composition ratio at which it precisely lattice-matches with InP. In this energy band structure, an energy gap Eg is 1.60 eV, and an electron affinity $\chi_1$ is assumed to be about 3.8 eV. An energy band diagram of InP is shown in FIG. 6B in which the energy gap Eg is 1.35 eV and an electron affinity $\chi_2$ is about 4.4 eV. Therefore, as shown in FIG. 6C, an energy spike having a magnitude ΔEc of about 0.6 eV corresponding to an electron affinity difference ($\chi_2 - \chi_1$) between $(AlAs)_x(GaSb)_{1-x}$ and InP is generated in a conduction band at the heterojunction therebetween.

A two-dimensional electron gas indicated by a dotted line in FIG. 5 is generated in the interface of the heterojunction of the HEMT according to this embodiment, i.e., in a portion of the undoped-InP channel layer 23 near the interface between the electron supply layer 24 consisting of n-AlGaAsSb and the channel layer 23. This two-dimensional electron gas is represented as follows in an energy band diagram of a region of the gate electrode 27 shown in FIG. 7. The left side of FIG. 7 corresponds to the gate electrode 27 (gate metal), its central portion corresponds to the electron supply layer 24 (n-$(AlAs)_x(GaSb)_{1-x}$), and its right side corresponds to the channel layer 23 (undoped InP). The energy level Ec at the bottom of the conduction band and a Fermi level $E_F$ are indicated by solid and dotted lines, respectively.

Figure 6C:
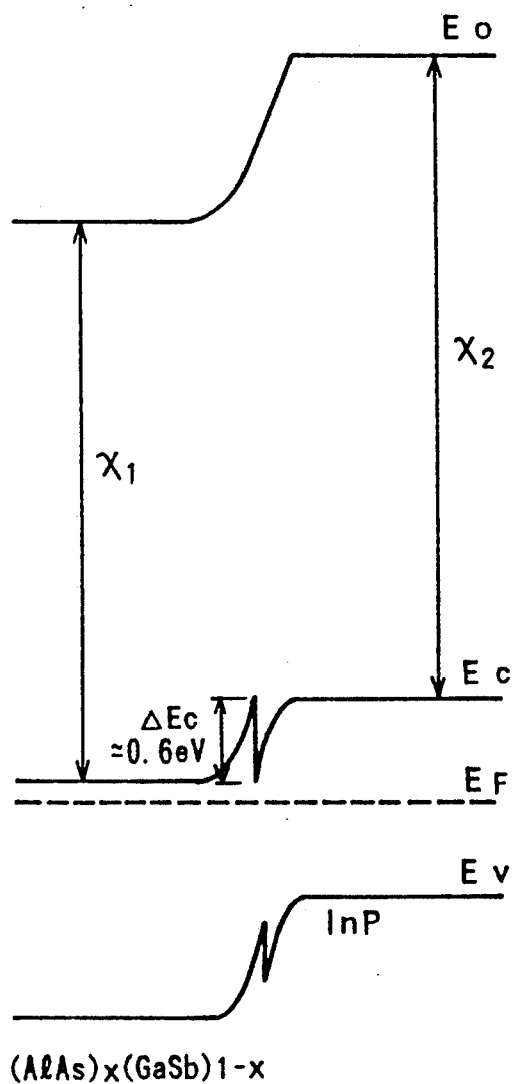

The energy spike having the magnitude ΔEc of about 600 meV shown in FIG. 6C appears in the junction portion between the electron supply layer 24 and the channel layer 23. Electrons released from a donor impurity added to the electron supply layer 24 are stored in this spike portion as indicated by a hatched line portion in FIG. 7 to generate a two-dimensional electron gas. The concentration of this two-dimensional electron gas is adjusted by an application voltage to the gate electrode 27.

As described above, the $(AlAs)_x(GaSb)_{1-x}$/InP heterojunction interface according to this embodiment also has good crystal lattice matching and high quality. Therefore, since the concentration of the interface level in the heterojunction interface is decreased, neither a drift in a drain current nor a hysteresis in transfer characteristics occurs unlike in a conventional heterojunction. In addition, the two-dimensional electron gas is formed in the channel layer 23 near the high-quality interface, and this channel layer 23 is formed by InP having good electron transport characteristics in a high electric field. For this reason, the mobility of the two-dimensional electron gas is increased. Therefore, the heterojunction according to this embodiment can also be effectively used in a high-frequency circuit element to which a high electric field is applied, as well as an HEMT.

Figure 7:
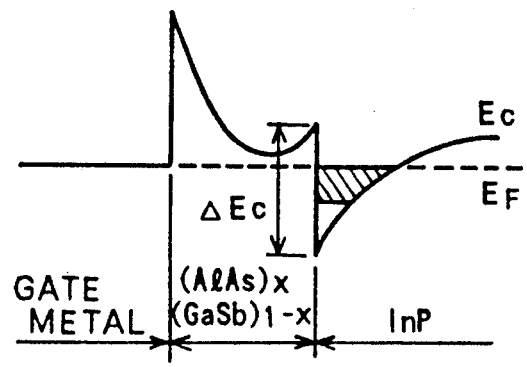
FIG. 7 is a diagram showing an energy band structure in a gate region of the HEMT according to the second embodiment.

An electron affinity difference between $(AlAs)_x(GaSb)_{1-x}$ and InP is about 0.6 eV as described above, and an electron affinity difference between AlInAs and InP in a conventional AlInAs/InP heterojunction is about 0.2 eV. For this reason, since the magnitude ΔEc of the energy spike shown in FIG. 7 is increased to be larger than that in the conventional heterojunction, the storage amount of the two-dimensional electron gas is increased to achieve a high gas concentration. Therefore, since a current amount to be supplied to the channel layer 23 of the HEMT is increased, there is provided a high-power, high-frequency circuit element having high current drive power.

Although the heterojunction according to the present invention is applied to an HEMT also in the above second embodiment, the present invention is not limited to the above embodiment. For example, the present invention can be similarly applied to an HBT to achieve the same effects as those obtained in the above embodiment. An HBT in this case is formed by using $(AlAs)_x(GaSb)_{1-x}$ ($0.4 \leq x \leq 0.6$), p-InP, and n-Inp as an emitter, a base, and a collector, respectively.

Figure 8:
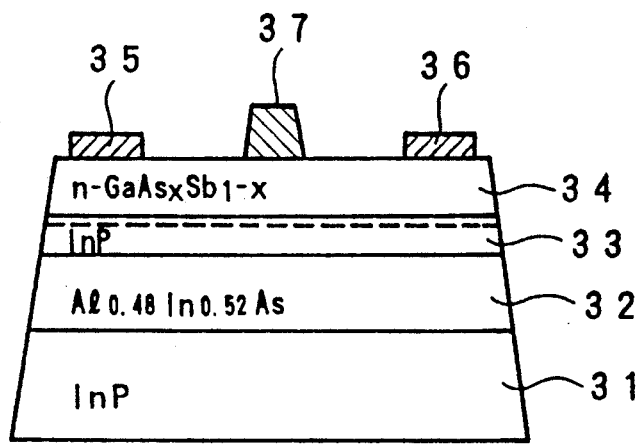
FIG. 8 is a sectional view showing a structure of an HEMT according to the third embodiment of the present invention.

FIG. 8 is a sectional view showing a structure of an InP-based HEMT according to the third embodiment of the present invention, which is completed via the following manufacturing steps.

First, a buffer layer 32, a channel layer 33, and an electron supply layer 34 are sequentially formed on a semi-insulating InP semiconductor substrate 31 by a crystal growth technique such as an MBE method. The buffer layer 32 consists of undoped $Al_{0.48}In_{0.52}As$ and has a thickness of about 1 μm. The channel layer 33 consists of undoped InP and has a thickness of 1,000 Å. The electron supply layer 34 consists of $GaAs_xSb_{1-x}$ wherein a composition ratio x of As is 0.4 to 0.6, and a donor impurity having a concentration of $1 \times 10^{18}/cm^3$ is added to this $GaAs_xSb_{1-x}$. At this composition ratio, the electron supply layer 34 consisting of n-$GaAs_xSb_{1-x}$ and the channel layer 33 consisting of undoped InP have good lattice matching. The thickness of the electron supply layer 34 is 500 Å.

Subsequently, mesa etching similar to those in the above embodiments is performed to electrically isolate the respective elements, and a metal such as AuGe/Ni is deposited on the electron supply layer 34 following the same procedures as in the above embodiments, thereby forming a source electrode 35 and a drain electrode 36.

Lastly, Ti/Pt/Au or the like is selectively formed to form a gate electrode 37. As a result, an HEMT having the structure shown in FIG. 8 is completed.

The lattice constants of GaAs and GaSb in the electron supply layer 34 are 5.65 Å and 6.10 Å, respectively. Therefore, since $GaAs_xSb_{1-x}$ is constituted such that the composition ratio x of As falls within the range of 0.4 to 0.6, $GaAs_xSb_{1-x}$ lattice-matches with InP having a lattice constant of 5.87 Å to form a heterojunction in a good junction state.

Figure 9A:
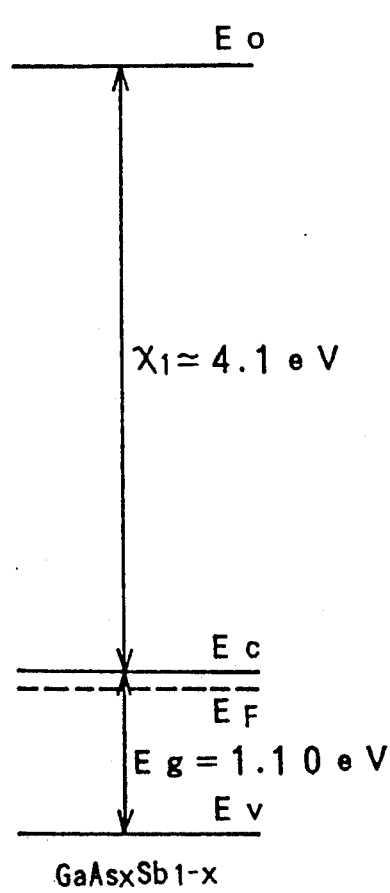
FIGS. 9A, 9B and 9C are diagrams showing an energy band structure of a heterojunction according to the third embodiment.
Figure 9B:
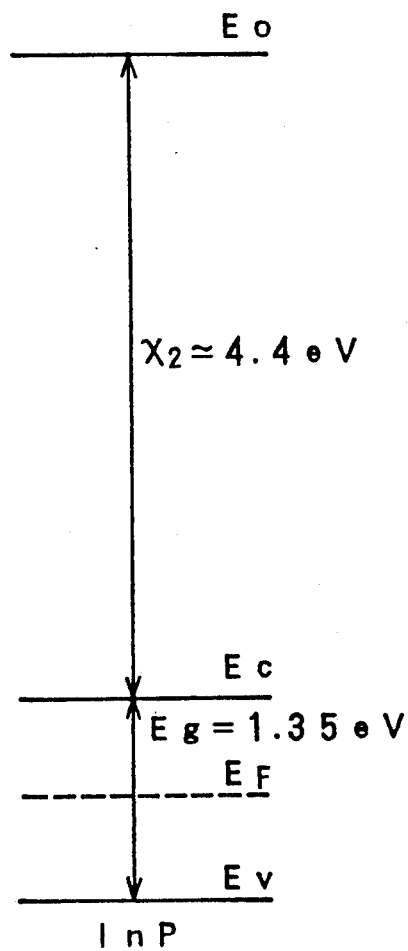

FIG. 9A is an energy band diagram of $GaAs_xSb_{1-x}$ at the above composition ratio at which it precisely lattice-matches with InP. In this energy band structure, an energy gap Eg is 1.10 eV, and an electron affinity $\chi_1$ is about 4.1 eV. An energy band diagram of InP is shown in FIG. 9B in which the energy gap Eg is 1.35 eV and an electron affinity $\chi_2$ is about 4.4 eV. Therefore, as shown in FIG. 9C, an energy spike having a magnitude $\Delta Ec$ of about 0.3 eV corresponding to an electron affinity difference $(\chi_2 - \chi_1)$ between $GaAs_xSb_{1-x}$ and InP is generated in a conduction band at the heterojunction therebetween.

A two-dimensional electron gas indicated by a dotted line in FIG. 8 is generated in the interface of the heterojunction of the HEMT according to this embodiment, i.e., in a portion of the undoped-InP channel layer 33 near the interface between the electron supply layer 34 consisting of $n$-$GaAs_xSb_{1-x}$ and the channel layer 33. This two-dimensional electron gas is represented as follows in an energy band diagram of a region of the gate electrode 37 shown in FIG. 10. The left side of FIG. 10 corresponds to the gate electrode 37 (gate metal), its central portion corresponds to the electron supply layer 34 ($n$-$GaAs_xSb_{1-x}$), and its right side corresponds to the channel layer 33 (undoped InP). The energy level Ec at the bottom of the conduction band and a Fermi level $E_F$ are indicated by solid and dotted lines, respectively.

Figure 9C:
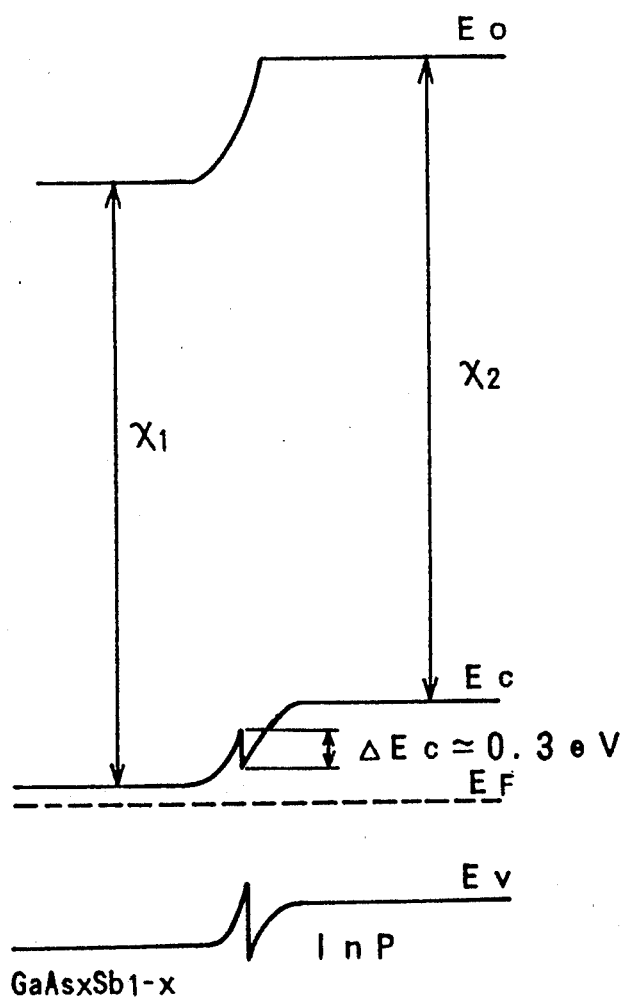

The energy spike having the magnitude $\Delta Ec$ of about 300 meV shown in FIG. 9C appears in the junction portion between the electron supply layer 34 and the channel layer 33. Electrons released from a donor impurity added to the electron supply layer 34 are stored in this spike portion as indicated by a hatched line portion in FIG. 10 to generate a two-dimensional electron gas. The concentration of this two-dimensional electron gas is adjusted by an application voltage to the gate electrode 37.

As described above, the $GaAs_xSb_{1-x}$/InP heterojunction interface according to this embodiment also has good crystal lattice matching and high quality. Therefore, since the concentration of the interface level in the heterojunction interface is decreased, neither a drift in a drain current nor a hysteresis in transfer characteristics occurs unlike in a conventional heterojunction. In addition, the two-dimensional electron gas is formed in the channel layer 33 near the high-quality interface, and this channel layer 33 is formed by InP having good electron transport characteristics in a high electric field. For this reason, the mobility of the two-dimensional electron gas is increased. Therefore, the heterojunction according to this embodiment can also be effectively used in a high-frequency circuit element to which a high electric field is applied, as well as an HEMT.

Figure 10:
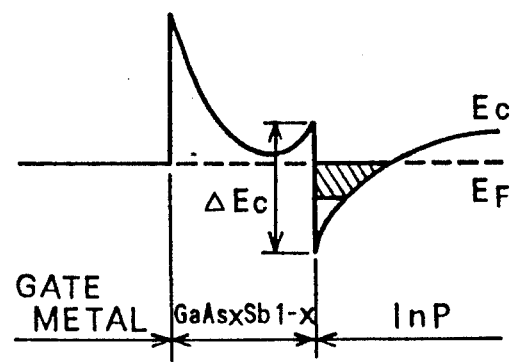
FIG. 10 is a diagram showing an energy band structure in a gate region of the HEMT according to the third embodiment.

An electron affinity difference between $GaAs_xSb_{1-x}$ and InP is about 0.3 eV as described above, and an electron affinity difference between AlInAs and InP in a conventional AlInAs/InP heterojunction is about 0.2 eV. For this reason, since the magnitude $\Delta Ec$ of the energy spike shown in FIG. 10 is increased to be larger than that in the conventional heterojunction, the storage amount of the two-dimensional electron gas is increased to achieve a high gas concentration. Therefore, since a current amount to be supplied to the channel layer 33 of the HEMT is increased, there is provided a high-power high-frequency circuit element having high current drive power.

Although the heterojunction according to the present invention is applied to an HEMT also in the above third embodiment, the present invention is not limited to the above embodiment. For example, the present invention can be similarly applied to an HBT to achieve the same effects as those obtained in the above embodiment. An HBT in this case is formed by using $GaAs_xSb_{1-x}$ ($0.4 < x < 0.6$), p-InP, and n-InP as an emitter, a base, and a collector, respectively.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A semiconductor device comprising a heterojunction of $(AlAs)_x(InSb)_{1-x}$ wherein a composition ratio x is 0.65 to 0.85 and InP.

2. A device according to claim 1, wherein said semiconductor device is a high electron mobility transistor.

3. A device according to claim 2, further comprising:
an InP semiconductor substrate;
a buffer layer formed on said InP semiconductor substrate;
a channel layer formed on said buffer layer and consisting of InP;
an electron supply layer, consisting of $(AlAs)_x(InSb)_{1-x}$, for forming said heterojunction according to claim 1 with said channel layer; and
a gate electrode and a pair of ohmic electrodes formed on said electron supply layer.

4. A device according to claim 1, wherein said semiconductor device is a heterojunction bipolar transistor.

5. A device according to claim 4, further comprising a collector consisting of InP, a base consisting of InP, and an emitter, consisting of $(AlAs)_x(InSb)_{1-x}$, for forming said heterojunction according to claim 1 with said base.

6. A semiconductor device comprising a heterojunction of $(AlAs)_x(GaSb)_{1-x}$ wherein a composition ratio x is 0.4 to 0.6 and Inp.

7. A device according to claim 6, wherein said semiconductor device is a high electron mobility transistor.

8. A device according to claim 7, further comprising:
an InP semiconductor substrate;
a buffer layer formed on said InP semiconductor substrate;
a channel layer formed on said buffer layer and consisting of InP;

an electron supply layer, consisting of $(AlAs)_x(GaSb)_{1-x}$, for forming said heterojunction according to claim 6 with said channel layer; and a gate electrode and a pair of ohmic electrodes formed on said electron supply layer.

9. A device according to claim 6, wherein said semiconductor device is a heterojunction bipolar transistor.

10. A device according to claim 9, further comprising a collector consisting of InP, a base consisting of InP, and an emitter, consisting of $(AlAs)_x(GaSb)_{1-x}$, for forming said heterojunction according to claim 6 with said base.

11. A semiconductor device comprising a heterojunction of $GaAs_xSb_{1-x}$ wherein a composition ratio x is 0.4 to 0.6 and Inp.

12. A device according to claim 11, wherein said semiconductor device is a high electron mobility transistor.

13. A device according to claim 12, further comprising:
an InP semiconductor substrate;
a buffer layer formed on said InP semiconductor substrate;
a channel layer formed on said buffer layer and consisting of InP;
an electron supply layer, consisting of $GaAs_xSb_{1-x}$, for forming said heterojunction according to claim 11 with said channel layer; and
a gate electrode and a pair of ohmic electrodes formed on said electron supply layer.

14. A device according to claim 11, wherein said semiconductor device is a heterojunction bipolar transistor.

15. A device according to claim 14, further comprising a collector consisting of InP, a base consisting of InP, and an emitter, consisting of $GaAs_xSb_{1-x}$, for forming said heterojunction according to claim 11 with said base.

* * * * *